(12) United States Patent
Oshima

(10) Patent No.: US 7,542,264 B2
(45) Date of Patent: Jun. 2, 2009

(54) CAPACITOR BLOCK AND LAMINATED BOARD

(75) Inventor: Shimpei Oshima, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 11/642,757

(22) Filed: Dec. 20, 2006

(65) Prior Publication Data

US 2007/0159273 A1 Jul. 12, 2007

(30) Foreign Application Priority Data

Dec. 27, 2005 (JP) ............................ 2005-375458

(51) Int. Cl.
*H01G 4/228* (2006.01)
*H01G 4/005* (2006.01)
*H01G 4/06* (2006.01)
*H03H 7/00* (2006.01)

(52) U.S. Cl. ................ 361/306.3; 361/303; 361/321.2; 333/185

(58) Field of Classification Search .............. 361/306.3, 361/303, 321.3; 333/185
See application file for complete search history.

(56) References Cited

U.S. PATENT DOCUMENTS 5,635,669 A * 6/1997 Kubota et al. ............... 174/524
6,115,234 A * 9/2000 Ishii et al. .................... 361/303
7,023,301 B2 * 4/2006 Kawahara et al. ............ 333/204
2002/0180561 A1 * 12/2002 Kawahara et al. ............ 333/175
2003/0025575 A1 * 2/2003 Orihara ....................... 333/185

FOREIGN PATENT DOCUMENTS

| JP | 05-335866 | | 12/1993 |
| JP | 06-062571 | | 3/1994 |
| JP | 2978553 | | 9/1999 |
| JP | 2002026677 A | * | 1/2002 |

\* cited by examiner

*Primary Examiner*—Eric Thomas
*Assistant Examiner*—David M Sinclair
(74) *Attorney, Agent, or Firm*—Knobbe Martens Olson & Bear LLP

(57) ABSTRACT

A capacitor block includes a first capacitor electrode connected to a first terminal, a first common capacitor electrode, a third capacitor electrode connected to a third terminal, a second common capacitor electrode, and a second capacitor electrode connected to a second terminal. One surface of the first capacitor electrode faces one surface of the first common capacitor electrode with a dielectric material therebetween. The other surface of the first common capacitor electrode faces one surface of the third capacitor electrode with a dielectric material therebetween. The other surface of the third capacitor electrode faces one surface of the second common capacitor electrode with a dielectric material therebetween. The other surface of the second common capacitor electrode faces one surface of the second capacitor electrode with a dielectric material therebetween. The first common capacitor electrode is electrically connected to the second common capacitor electrode.

7 Claims, 13 Drawing Sheets

FIG. 18 – PRIOR ART

FIG. 19 – PRIOR ART
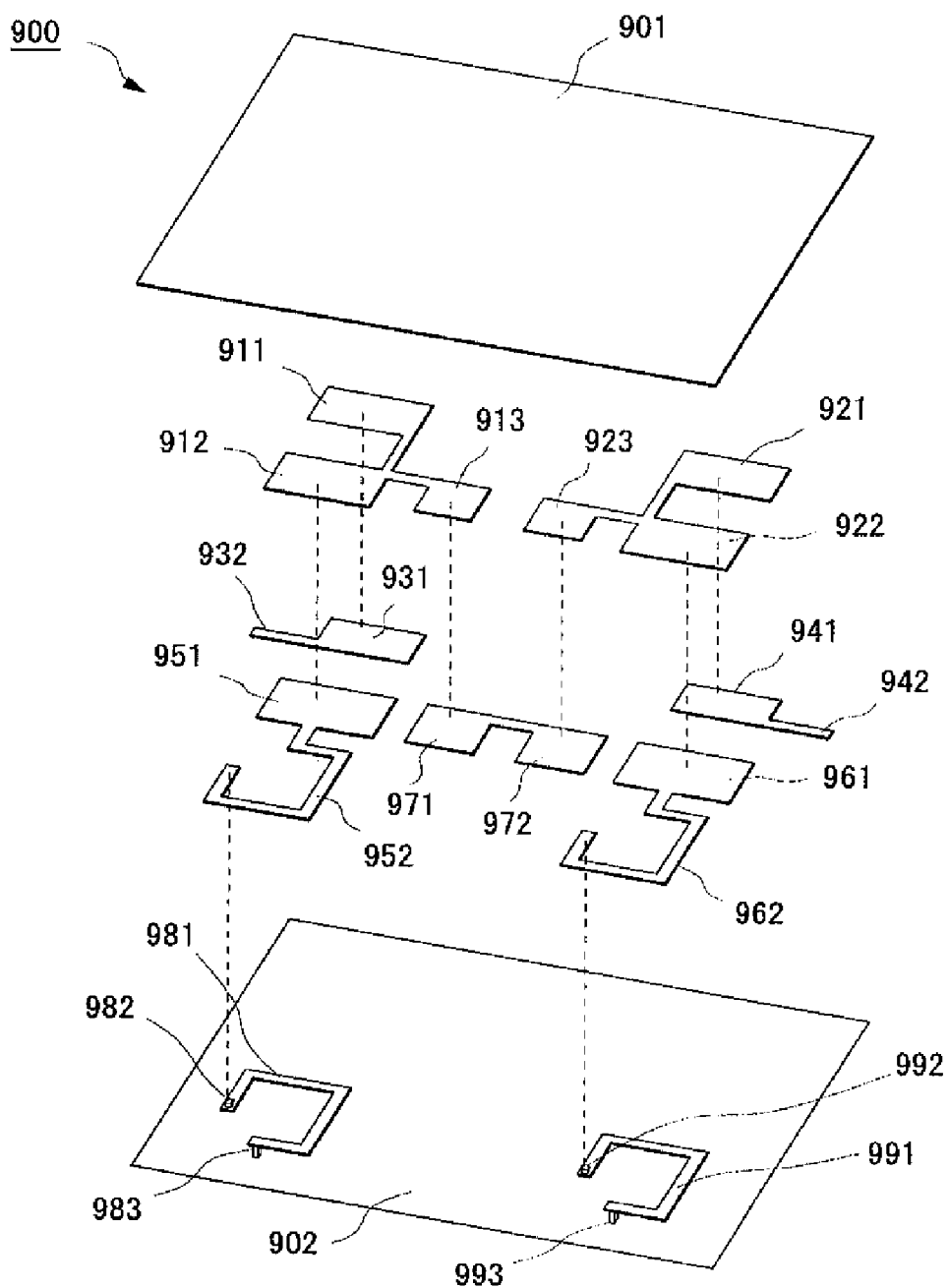

CAPACITOR BLOCK AND LAMINATED BOARD

BACKGROUND OF THE INVENTION

1. Field of the Invention

The present invention relates to a capacitor block used for a filter circuit and, in particular, to a capacitor block including a plurality of capacitors electrically connected to each other and a laminated board having the capacitor block.

2. Description of the Related Technology

This type of capacitor block is described in, for example, Japanese Patent No. 2978553. The capacitor block includes a laminated board incorporating a plurality of capacitor electrodes. Two of the capacitor electrodes disposed in the outermost layers function as GND electrodes. Two or more capacitor electrodes sandwiched by the two outermost layers are laminated with a dielectric layer therebetween. Since a ground-type π or T capacitor block having such a structure requires no conductors that connect the capacitors to each other and the GND electrodes are disposed in the outermost layers, the stray capacitance can be advantageously reduced.

However, in this capacitor block, capacitor electrodes to be connected to external terminals are disposed close to each other. Accordingly, when the size of the capacitor block is reduced and the distance between the capacitor electrodes is decreased, extra parasitic capacitance is generated. As a result, it becomes difficult to design a variety of filters. Conversely, if the distance between the capacitor electrode is increased in order to reduce the parasitic capacitance, the size of the capacitor block is increased, and therefore, realizing a compact capacitor block is difficult. In addition, since the capacitor block has a sandwich structure with the two outermost GND electrodes, it is difficult to form a compact filter circuit having more than three stages that require more than two GND connections.

SUMMARY OF CERTAIN INVENTIVE ASPECTS

Accordingly, it is an object of certain inventive aspects to provide a capacitor block capable of being applied to a wide range of applications and a laminated board including the capacitor block.

According to an embodiment of the present invention, a capacitor block includes a plurality of capacitor electrodes stacked so that neighboring capacitor electrodes face each other with a dielectric material disposed therebetween. The capacitor electrodes include at least three capacitor electrodes connected to different terminals and at least two common capacitor electrodes isolated from the outside. Each of the capacitor electrodes is disposed so as to face one of the common capacitor electrodes with the dielectric material therebetween, each of the common capacitor electrodes is disposed between two of the capacitor electrodes, and two of the common capacitor electrodes that sandwiches one of the capacitor electrodes sandwiched between the dielectric materials are electrically connected to each other.

According to certain inventive aspects, a first capacitor is formed by the first capacitor electrode and one common capacitor electrode that faces the first capacitor electrode. A second capacitor is formed by a capacitor electrode of the electrode unit and two common capacitor electrodes that face the capacitor electrode. In addition, a third capacitor is formed by the second capacitor electrode and one common capacitor electrode that faces the second capacitor electrode. Since one end of the first capacitor, one end of the second capacitor, and one end of the third capacitor are connected to each other via the common capacitor electrodes, a three-terminal T capacitor block is formed.

According to another embodiment of the present invention, a laminated board includes an electronic component embedded therein, where the electronic component is formed from a conductor pattern, and a capacitor block including a plurality of capacitor electrodes so that neighboring capacitor electrodes face each other with a dielectric material disposed therebetween. The capacitor electrodes include at least three capacitor electrodes connected to different wirings and at least two common capacitor electrodes isolated from the outside. Each of the capacitor electrodes is disposed so as to face one of the common capacitor electrodes with the dielectric material therebetween, each of the common capacitor electrodes is disposed between two of the capacitor electrodes, and two of the common capacitor electrodes that sandwiches one of the capacitor electrodes sandwiched between the dielectric materials are electrically connected to each other.

According to certain inventive aspects, the capacitor block is embedded in the laminated circuit board so as to function as an electronic component.

According to certain inventive aspects, since a capacitor block having three or more terminals can be easily manufactured by combining the electrode unit including the common capacitor electrode and the capacitor electrode, the capacitor block can be applied to a wide range of applications. In addition, since the capacitor block can reduce capacitance coupling between capacitor electrodes, a high-frequency highpass filter or a high-frequency bandpass filter of a desired characteristic and of reduced size can be easily manufactured. Furthermore, a compact filter having three or more stages can be easily manufactured.

According to certain inventive aspects, since the capacitor block is embedded in the laminated board, the capacitor block can be applied to a wide range of applications. By using the capacitor block, a high-frequency highpass filter and a high-frequency bandpass filter of reduced size can be easily manufactured.

BRIEF DESCRIPTION OF THE DRAWINGS

FIG. 18 is a transparent perspective view of a known laminated circuit board for comparison with the ninth embodiment; and FIG. 19 is an exploded perspective view of the known laminated circuit board for comparison with the ninth embodiment.

DETAILED DESCRIPTION OF CERTAIN ILLUSTRATIVE EMBODIMENTS

Embodiments of the present invention are described with reference to the accompanying drawings.

Figure 1:
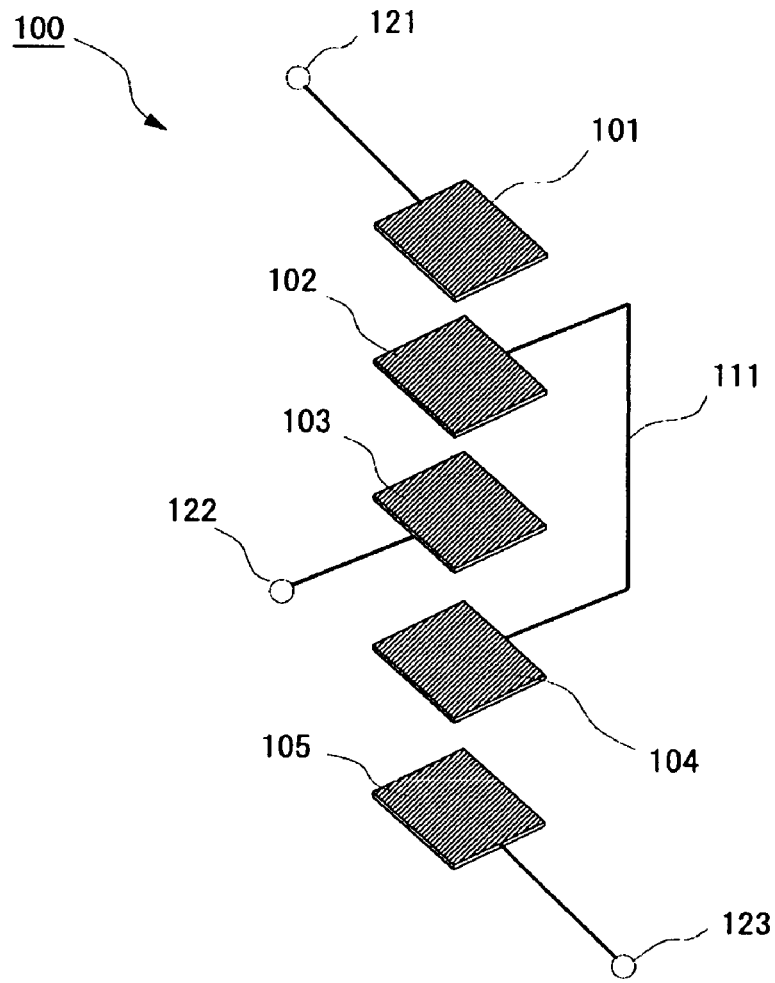
FIG. 1 is an exploded perspective view of a main portion of a capacitor block according to a first embodiment of the present invention.
Figure 2:
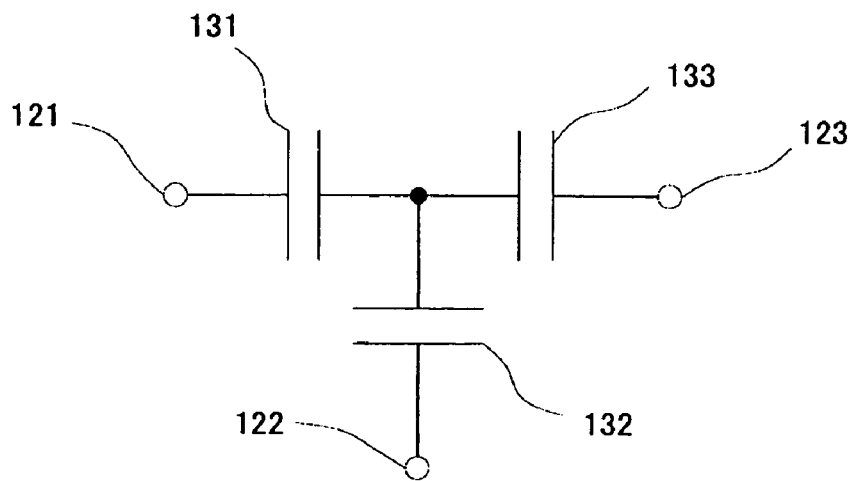
FIG. 2 is a circuit diagram of the capacitor block according to the first embodiment of the present invention.

FIGS. 1 and 2 illustrate a capacitor block according to a first embodiment of the present invention. FIG. 1 is an exploded perspective view of a main portion of the capacitor block according to a first embodiment of the present invention. FIG. 2 is a circuit diagram of the capacitor block according to the first embodiment of the present invention.

As shown in FIG. 1, a capacitor block 100 includes five capacitor electrodes 101 to 105 arranged in the vertical direction. The capacitor electrodes 101 to 105 are rectangular and have the same dimensions. The capacitor electrodes 101 to 105 are disposed in parallel in a vertical direction with a dielectric material disposed between the capacitor electrodes 101 to 105 that neighbor each other so as to face each other with a predetermined distance therebetween. Additionally, as shown in FIG. 1, the capacitor electrode 102 (hereinafter referred to as a "first common capacitor electrode"), which is the second electrode from the top, is electrically connected to the capacitor electrode 104 (hereinafter referred to as a "second common capacitor electrode"), which is the fourth electrode from the top, using a connection conductor 111. A first external terminal 121 is connected to the capacitor electrode 101 (a first capacitor electrode), which is the first electrode from the top. A second external terminal 122 is connected to the capacitor electrode 103 (a third capacitor electrode), which is the third electrode from the top. A third external terminal 123 is connected to the capacitor electrode 105 (a second capacitor electrode), which is the fifth electrode from the top.

In such a structure, the capacitor electrode 101 and the capacitor electrode 105 form a pair of capacitor electrodes. In addition, the common capacitor electrodes 102 and 104 and the capacitor electrode 103 form an electrode unit.

The circuit diagram of the capacitor block 100 having such a structure is shown in FIG. 2. As shown in FIG. 2, a first capacitor 131 is connected to a third capacitor 133 in series between the first external terminal 121 and the third external terminal 123. A second capacitor 132 is connected between the second external terminal 122 and a connection point between the first capacitor 131 and the third capacitor 133. Here, the first capacitor 131 is formed by the capacitor electrode 101 and the common capacitor electrode 102. The second capacitor 132 is formed by the common capacitor electrode 102, the capacitor electrode 103, and the common capacitor electrodes 102 and 104. The third capacitor 133 is formed by the common capacitor electrode 104 and the second capacitor electrode 105. In such a structure, if the dimensions of all the capacitor electrodes 101 to 105 are the same and if the distances between neighboring electrodes among the capacitor electrodes 101 to 105 are the same and the dielectric constants between the neighboring electrodes are the same, the electrostatic capacitance of the second capacitor 132 is double the electrostatic capacitance of each of the first capacitor 131 and the third capacitor 133.

According to the present embodiment, since the capacitor block 100 functions as a three-terminal T-type capacitor block, the capacitor block 100 can be applied to a wide range of applications. By using this capacitor block 100, a high-frequency highpass filter or bandpass filter of reduced size can be easily manufactured.

When the capacitor block 100 is used for a practical application, it is desirable that a dielectric material is disposed between the neighboring electrodes among the capacitor electrodes 101 to 105.

A second embodiment of the present invention is described next.

Figure 3:
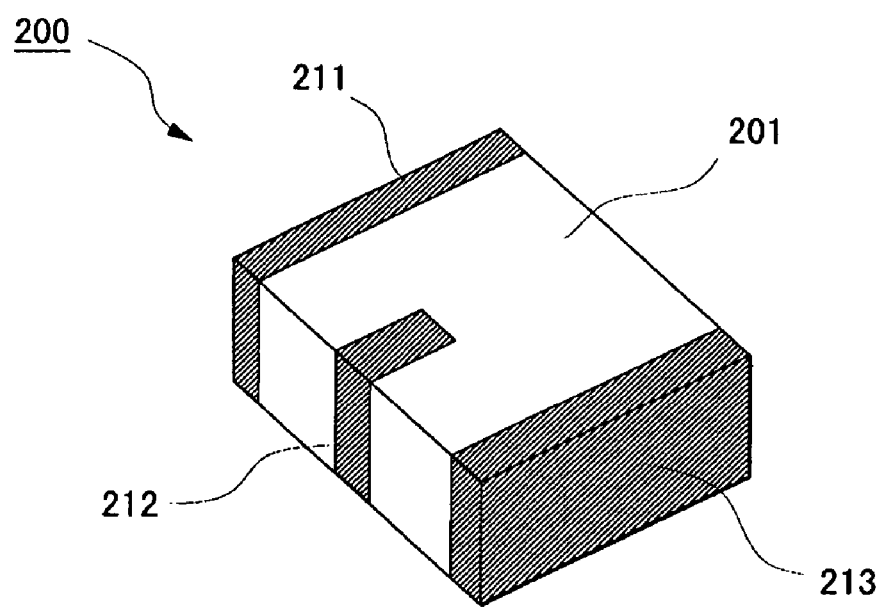
FIG. 3 is an external perspective view of a composite capacitor element according to a second embodiment of the present invention.
Figure 4:
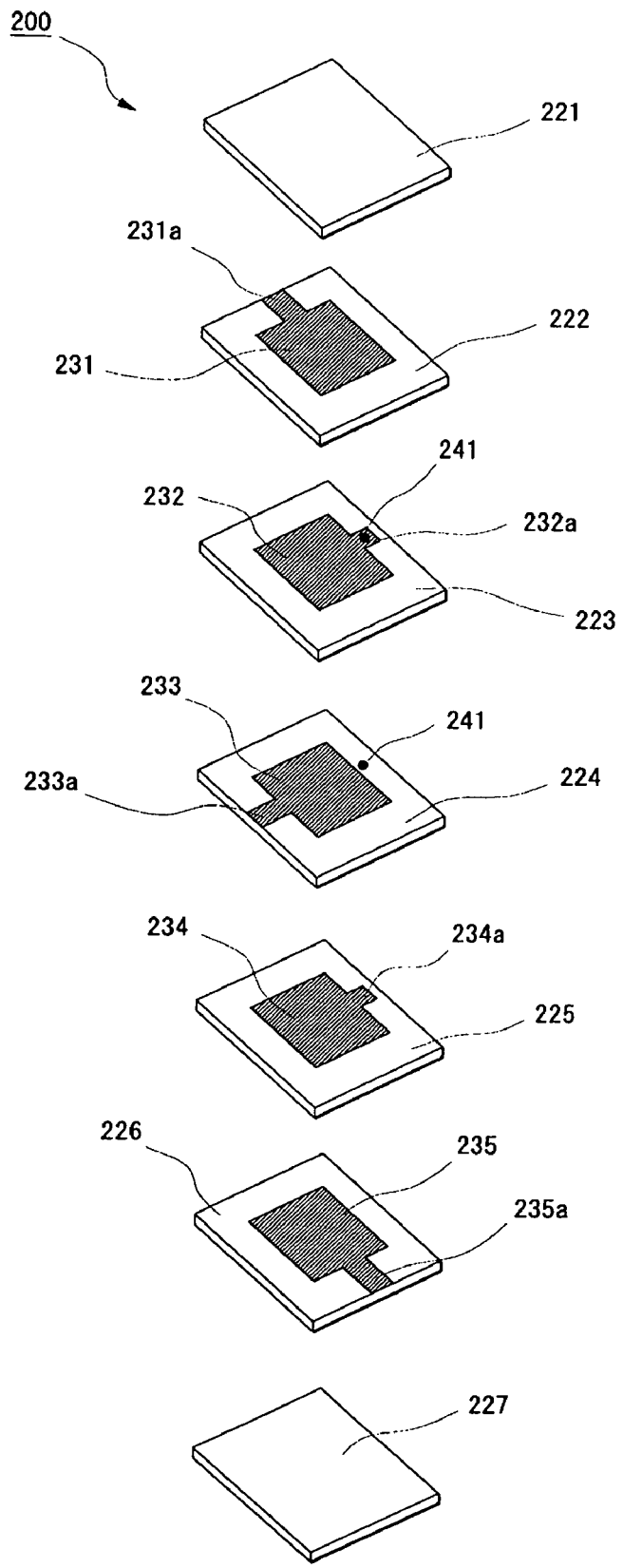
FIG. 4 is an exploded perspective view of the composite capacitor element according to the second embodiment of the present invention.

FIGS. 3 and 4 illustrate a composite capacitor element according to a second embodiment of the present invention. More specifically, FIG. 3 is an external perspective view of the composite capacitor element according to'the second embodiment of the present invention while FIG. 4 is an exploded perspective view of the composite capacitor element according to the second embodiment of the present invention.

According to the second embodiment, the composite capacitor element includes the capacitor block according to the first embodiment.

As shown in FIGS. 3 and 4, a composite capacitor element 200 includes dielectric layers 221 and 227, a base 201, and first to third external electrodes 211 to 213. The base 201 includes stacked dielectric layers 222 to 226 having capacitor electrodes 231 to 235 formed thereon, respectively. The external electrodes 211 to 213 are connected to predetermined capacitor electrodes through the outer surface of the base 201.

Each of the dielectric layers 221 to 227 is formed of a sintered ceramic having a rectangular sheet shape. The sintered ceramic is composed of, for example, a dielectric ceramic material consisting primarily of magnesium titanate or a low-temperature co-fired ceramic (LTCC) material.

The capacitor electrode 231 corresponds to the first capacitor electrode 101 of the first embodiment. The capacitor electrode 231 is formed on the upper surface of the dielectric layer 222 so as to have a rectangular shape in plan view in the central section of the upper surface. The capacitor electrode 231 further includes a connection electrode 231a extending from a side of the rectangular shape. The connection electrode 231a is connected to the first external electrode 211.

The capacitor electrode 232 corresponds to the common capacitor electrode 102 of the first embodiment. The capacitor electrode 232 is formed on the upper surface of the dielectric layer 223 so as to have a rectangular shape in plan view in the central section of the upper surface. The capacitor electrode 232 further includes a connection electrode 232a extending from a side of the rectangular shape. A via conductor 241 that passes through the dielectric layer 223 in the thickness direction thereof is connected to the connection electrode 232a. Additionally, the via conductor 241 is connected to a connection electrode 234a of the capacitor electrode 234 formed on the upper surface of the dielectric layer 225 using another via conductor 241 formed in the dielectric layer 224 in the same way.

The capacitor electrode 233 corresponds to the capacitor electrode 103 of the first embodiment. The capacitor electrode 233 is formed on the upper surface of the dielectric layer 224 so as to have a rectangular shape in plan view in the central section of the upper surface. The capacitor electrode 233 further includes a connection electrode 233a extending from a side of the rectangular shape. The connection electrode 233a is connected to the second external electrode 212.

The capacitor electrode 234 corresponds to the common capacitor electrode 104 of the first embodiment. The capacitor electrode 234 is formed on the upper surface of the dielectric layer 225 so as to have a rectangular shape in plan view in the central section of the upper surface. The capacitor electrode 234 further includes the connection electrode 234a extending from a side of the rectangular shape. As noted above, the connection electrode 234a is connected to the capacitor electrode 232 using the via conductors 241.

The capacitor electrode 235 corresponds to the second capacitor electrode 105 of the first embodiment. The capacitor electrode 235 is formed on the upper surface of the dielectric layer 226 so as to have a rectangular shape in plan view in the central section of the upper surface. The capacitor electrode 235 further includes the connection electrode 235a extending from a side of the rectangular shape. The connection electrode 235a is connected to the third external electrode 213.

Each of the capacitor electrodes 231 to 235 is formed from a metallic thin film generated by sintering metal paste. For example, the metal paste consists of primarily a metallic material, such as Pd, Ag, or Cu.

The external electrodes 211 to 213 are formed from a material similar to that of the capacitor electrodes 231 to 235. In order to increase the solder wettability, solder plating (not shown) is conducted on the surfaces of the external electrodes 211 to 213.

The composite capacitor element 200 according to the present embodiment can be applied to a wide range of applications. According to the composite capacitor element 200, a three-terminal T-type capacitor block can be easily employed, and therefore, a high-frequency highpass filter or a high-frequency bandpass filter of reduced size can be easily manufactured.

A third embodiment of the present invention is described next.

Figure 5:
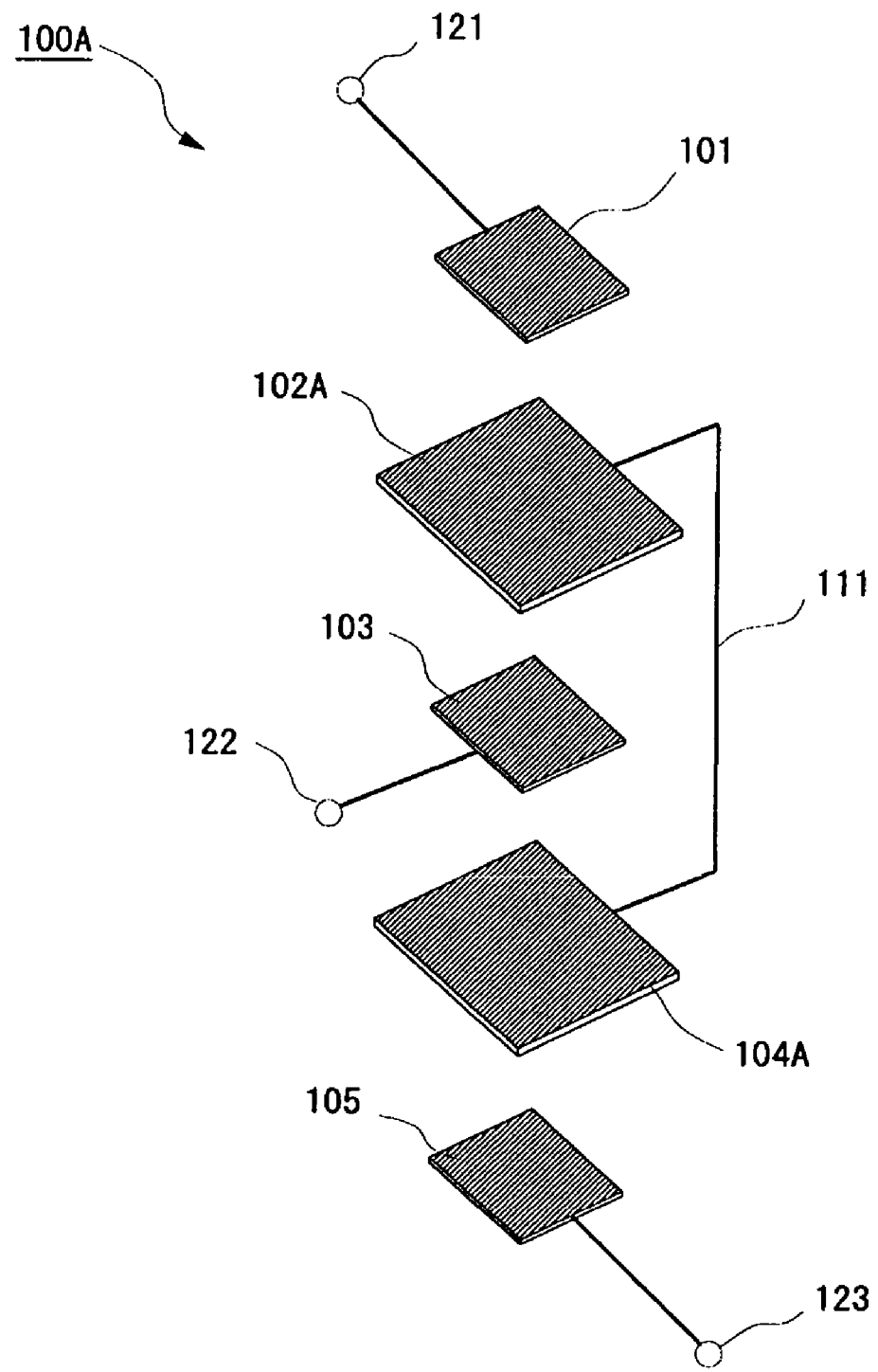
FIG. 5 is an exploded perspective view of a main portion of a capacitor block according to a third embodiment of the present invention.

FIG. 5 is an exploded perspective view of a main portion of a capacitor block according to a third embodiment of the present invention. The same components as those illustrated and described in relation to the first embodiment are designated by the same reference numerals, and therefore, descriptions thereof are not repeated. The differences between the third embodiment and the first embodiment are that a capacitor block 100A of the third embodiment uses a common capacitor electrode 102A and a common capacitor electrode 104A in place of the common capacitor electrode 102 and the common capacitor electrode 104 of the first embodiment. Here, the dimensions of the common capacitor electrode 102A are larger than those of the first capacitor electrode 101 and the third capacitor electrode 103. In addition, the dimensions of the common capacitor electrode 104A are larger than those of the third capacitor electrode 103 and the second capacitor electrode 105.

In the present embodiment, by setting the dimensions of the common capacitor electrode 102A and the common capacitor electrode 104 functioning as common capacitor electrodes to a large value, the electric field coupling (capacitance coupling) of the first capacitor electrode 101 and the third capacitor electrode 103 caused by an actual assembly-to-assembly variation, such as printing variation or laminating variation, can be reduced. In addition, an electric field coupling (capacitance coupling) of the third capacitor electrode 103 and the second capacitor electrode 105 can be reduced.

A fourth embodiment of the present invention is described next.

Figure 6:
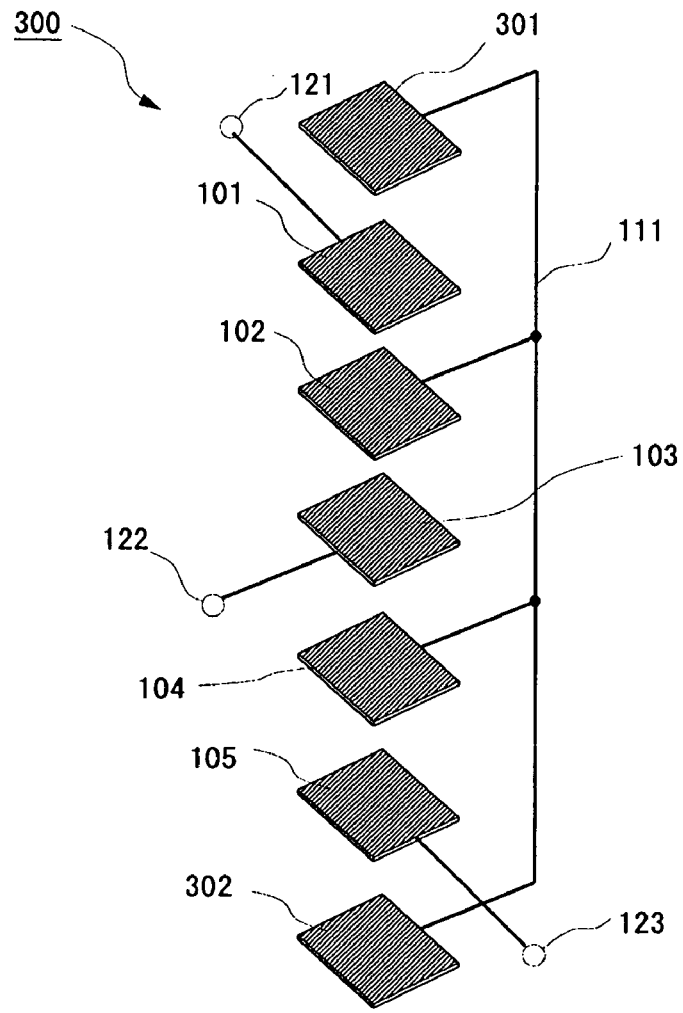
FIG. 6 is an exploded perspective view of a main portion of a capacitor block according to a fourth embodiment of the present invention.

FIG. 6 is an exploded perspective view of a main portion of a capacitor block according to a fourth embodiment of the present invention. The same components as those illustrated and described in relation to the first embodiment are designated by the same reference numerals, and therefore, descriptions thereof are not repeated. The differences between the fourth embodiment and the first embodiment are that, in the fourth embodiment, a common capacitor electrode 301 is disposed above the first capacitor electrode 101 and a common capacitor electrode 302 is disposed under the second capacitor electrode 105. Thus, a capacitor block 300 is achieved in which these common capacitor electrodes 301 and 302 are electrically connected to the common capacitor electrode 102 and the common capacitor electrode 104 using the connection conductor 111.

Thus, the first capacitor 131 is formed by the first capacitor electrode 101, the common capacitor electrode 102, and the common capacitor electrode 301 whereas the third capacitor 133 is formed by the second capacitor electrode 105, the common capacitor electrode 104, and the common capacitor electrode 302.

By providing the common capacitor electrodes 301 and 302, the electrostatic capacitance of the first capacitor 131 formed by the first capacitor electrode 101 and the electrostatic capacitance of the third capacitor 133 formed by the second capacitor electrode 105 can be increased.

A fifth embodiment of the present invention is described next.

Figure 7:
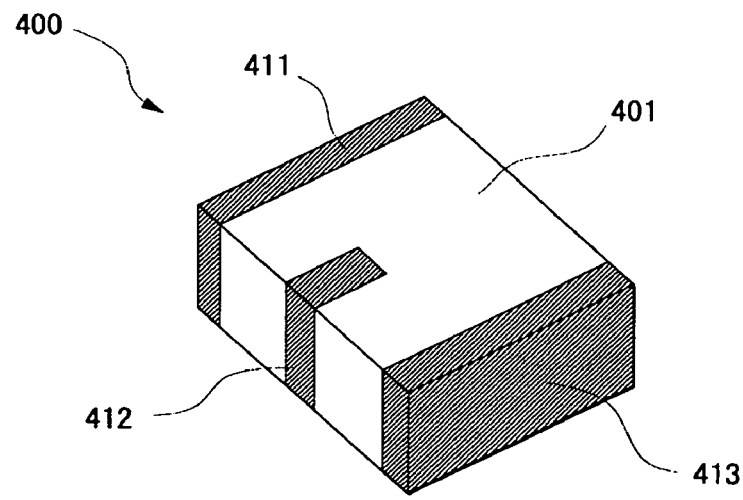
FIG. 7 is an external perspective view of a composite capacitor element according to a fifth embodiment of the present invention.
Figure 8:
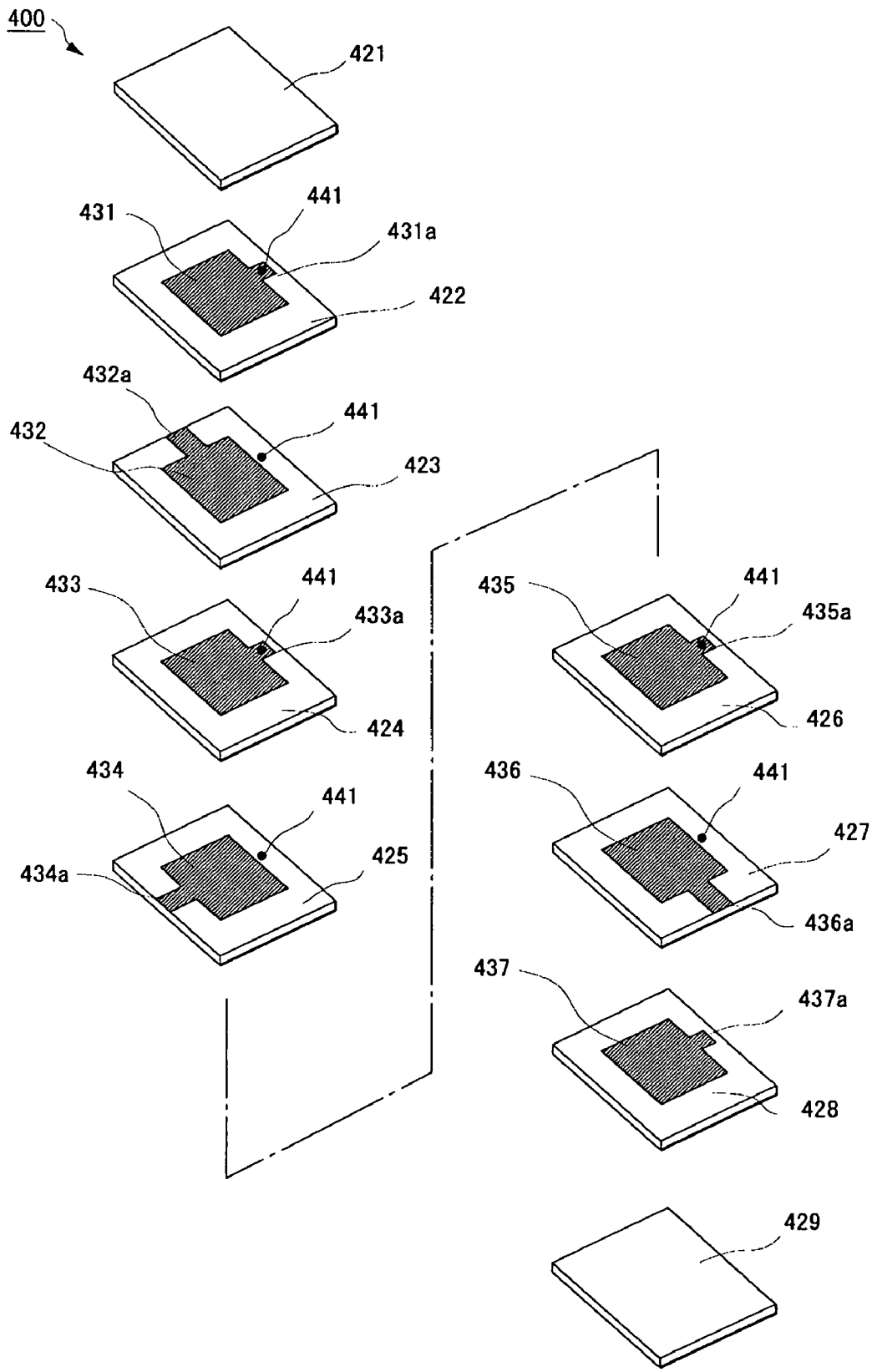
FIG. 8 is an exploded perspective view of the composite capacitor element according to the fifth embodiment of the present invention.

FIGS. 7 and 8 illustrate a composite capacitor element according to a fifth embodiment of the present invention. More specifically, FIG. 7 is an external perspective view of the composite capacitor element according to the fifth embodiment of the present invention. FIG. 8 is an exploded perspective view of the composite capacitor element according to the fifth embodiment of the present invention.

According to the fifth embodiment, the composite capacitor element includes the capacitor block according to the fourth embodiment.

As shown in FIGS. 7 and 8, a composite capacitor element 400 includes a base 401 and first to third external electrodes 411 to 413. The base 401 includes dielectric layers 421 and 429 and stacked dielectric layers 422 to 428 having capacitor electrodes 431 to 437 formed thereon, respectively. The external electrodes 411 to 413 are connected to predetermined capacitor electrodes through the outer surface of the base 401.

Each of the dielectric layers 421 to 429 is formed of a sintered ceramic having a rectangular sheet shape. The sintered ceramic is composed of, for example, a dielectric ceramic material consisting primarily of magnesium titanate or a low-temperature co-fired ceramic (LTCC) material.

The capacitor electrode 431 corresponds to the common capacitor electrode 301 of the fourth embodiment. The capacitor electrode 431 is formed on the upper surface of the dielectric layer 422 so as to have a rectangular shape in plan view in the central section of the upper surface. The capacitor electrode 431 further includes a connection electrode 431a extending from a side of the rectangular shape. A via conductor 441 that passes through the dielectric layers 422 in the thickness direction thereof is connected to the connection electrode 431a. Additionally, the via conductor 441 is connected to a connection electrode 433a of the capacitor electrode 433 formed on the upper surface of the dielectric layer 424 using another via conductor 441 formed in the dielectric layer 423 in the same way.

The capacitor electrode 432 corresponds to the first capacitor electrode 101 of the fourth embodiment. The capacitor electrode 432 is formed on the upper surface of the dielectric layer 423 so as to have a rectangular shape in plan view in the central section of the upper surface. The capacitor electrode 432 further includes a connection electrode 432a extending from a side of the rectangular shape. The connection electrode 432a is connected to the first external electrode 411.

The capacitor electrode 433 corresponds to the common capacitor electrode 102 of the fourth embodiment. The capacitor electrode 433 is formed on the upper surface of the dielectric layer 424 so as to have a rectangular shape in plan view in the central section of the upper surface. The capacitor electrode 433 further includes the connection electrode 433a extending from a side of the rectangular shape. A via conductor 441 that passes through the dielectric layers 424 in the thickness direction thereof is connected to the connection electrode 433a. Additionally, this via conductor 441 is connected to a connection electrode 435a of the capacitor electrode 435 formed on the upper surface of the dielectric layer 426 using another via conductor 441 formed in the dielectric layer 425 in the same way.

The capacitor electrode 434 corresponds to the third capacitor electrode 103 of the fourth embodiment. The capacitor electrode 434 is formed on the upper surface of the dielectric layer 425 so as to have a rectangular shape in plan view in the central section of the upper surface. The capacitor electrode 434 further includes a connection electrode 434a extending from a side of the rectangular shape. The connection electrode 434a is connected to the second external electrodes 412.

The capacitor electrode 435 corresponds to the common capacitor electrode 104 of the fourth embodiment. The capacitor electrode 435 is formed on the upper surface of the dielectric layer 426 so as to have a rectangular shape in plan view in the central section of the upper surface. The capacitor electrode 435 further includes a connection electrode 435a extending from a side of the rectangular shape. The connection electrode 435a is connected to the capacitor electrode 433 using the via conductor 441.

The capacitor electrode 436 corresponds to the second capacitor electrode 105 of the fourth embodiment. The capacitor electrode 436 is formed on the upper surface of the dielectric layer 427 so as to have a rectangular shape in plan view in the central section of the upper surface. The capacitor electrode 436 further includes a connection electrode 436a extending from a side of the rectangular shape. The connection electrode 436a is connected to the third external electrode 413.

The capacitor electrode 437 corresponds to the common capacitor electrode 302 of the fourth embodiment. The capacitor electrode 437 is formed on the upper surface of the dielectric layer 428 so as to have a rectangular shape in plan view in the central section of the upper surface. The capacitor electrode 437 further includes a connection electrode 437a extending from a side of the rectangular shape. The connection electrode 437a is connected to the connection electrode 435a of the capacitor electrode 435 formed on the upper surface of the dielectric layer 426 using the via conductor 441.

Each of the capacitor electrodes 431 to 437 is formed from a metallic thin film generated by sintering metal paste. For example, the metal paste consists of primarily a metallic material, such as Pd, Ag, or Cu.

The external electrodes 411 to 413 are formed from a material similar to that of the capacitor electrodes 431 to 437. In order to increase the solder wettability, solder plating (not shown) is conducted on the surfaces of the external electrodes 411 to 413.

The composite capacitor element 400 according to the present embodiment can be applied to a wide range of applications. According to the composite capacitor element 400, a three-terminal T-type capacitor block can be easily employed, and therefore, a high-frequency highpass filter or a high-frequency bandpass filter of reduced size can be easily manufactured. In addition, like the second capacitor 132, the first capacitor 131 and the third capacitor 133 can have a large electrostatic capacitance.

A sixth embodiment of the present invention is described next.

Figure 9:
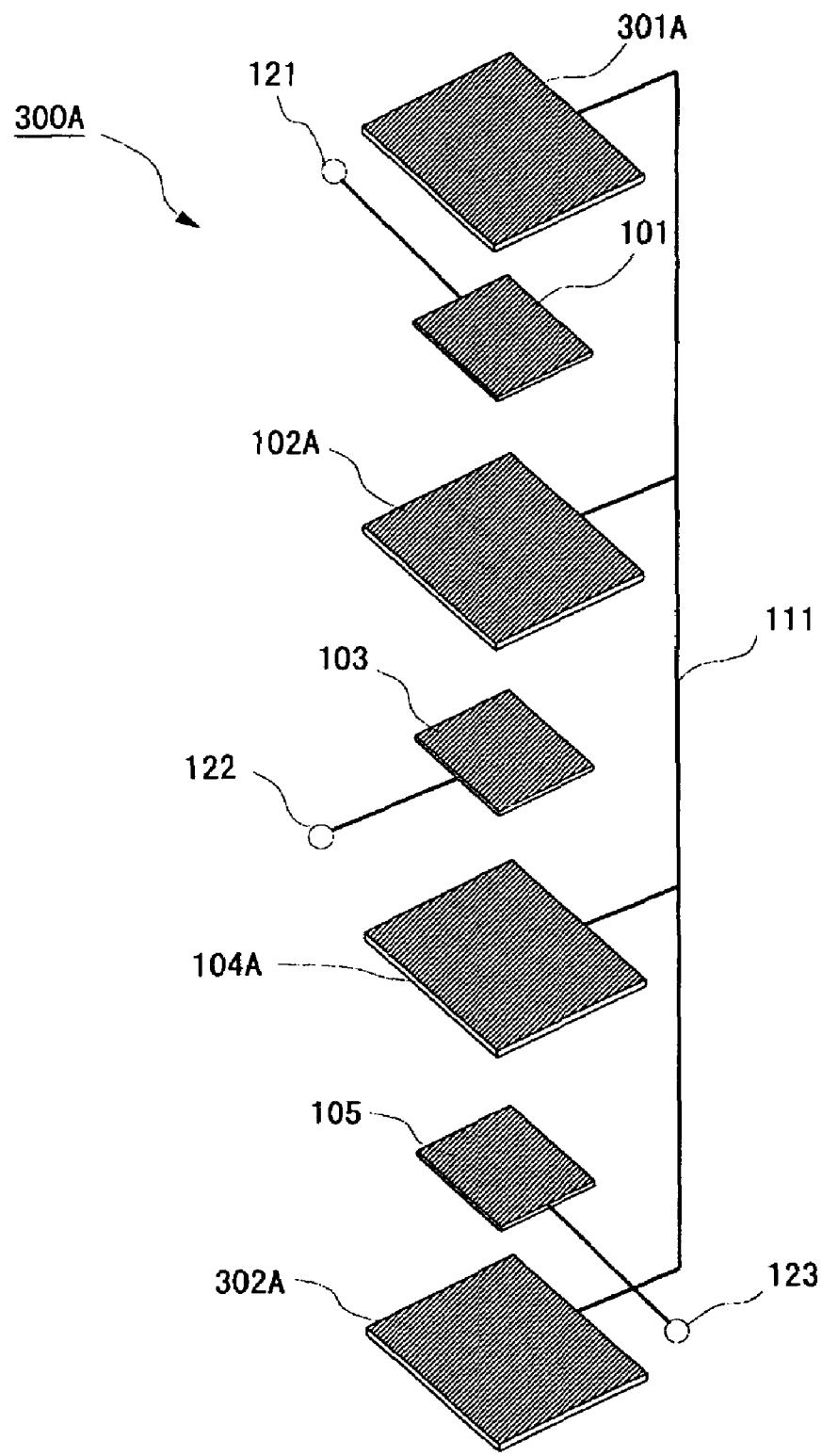
FIG. 9 is an exploded perspective view of a main portion of a capacitor block according to a sixth embodiment of the present invention.

FIG. 9 is an exploded perspective view of a main portion of a capacitor block according to a sixth embodiment of the present invention. The same components as those illustrated and described in relation to the fourth embodiment are designated by the same reference numerals, and therefore, descriptions thereof are not repeated. The differences between the sixth embodiment and the fourth embodiment are that a capacitor block 300A according to the sixth embodiment includes common capacitor electrodes 301A and 302A and the common capacitor electrodes 102A and 104A in place of the common capacitor electrodes 301 and 302 and the common capacitor electrodes 102 and 104 according to the fourth embodiment. Here, the dimensions of the common capacitor electrodes 301A are larger than those of the first capacitor electrode 101. In addition, the dimensions of the common capacitor electrode 302A are larger than those of the second capacitor electrode 105. Furthermore, the dimensions of the common capacitor electrode 102A are larger than those of the first capacitor electrode 101 and the third capacitor electrode 103. The dimensions of the common capacitor electrode 104A are larger than those of the third capacitor electrode 103 and the second capacitor electrode 105.

In the present embodiment, by setting the dimensions of the common capacitor electrode 102A and the common capacitor electrode 104A to be large, the electric field coupling (capacitance coupling) of the first capacitor electrode 101 and the third capacitor electrode 103 caused by an actual assembly-to-assembly variation, such as printing variation or laminating variation, can be reduced. In addition, an electric field coupling (capacitance coupling) of the third capacitor electrode 103 and the second capacitor electrode 105 can be reduced.

A seventh embodiment of the present invention is described next.

Figure 10:
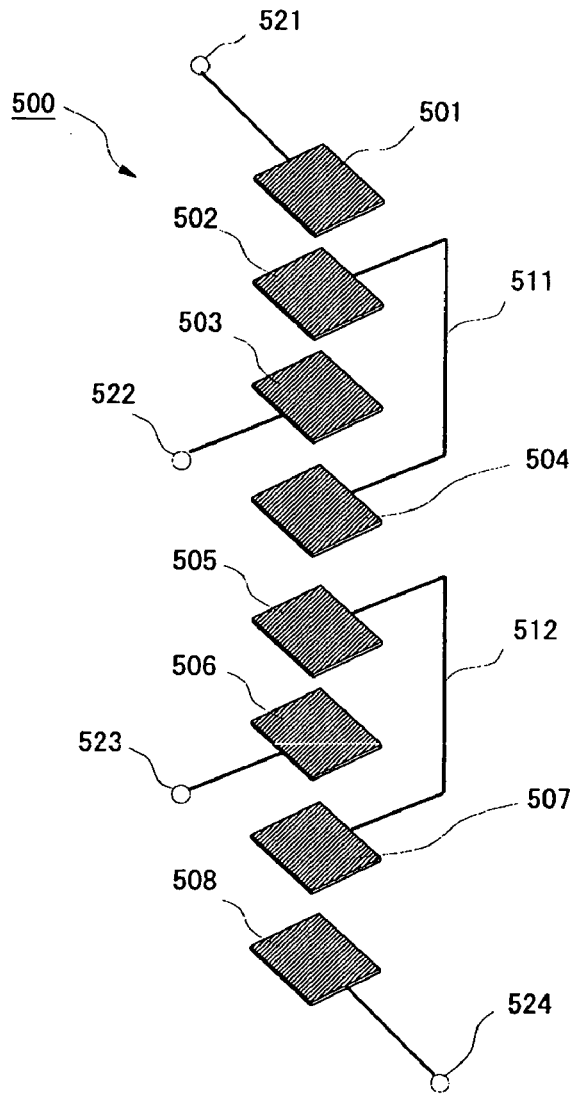
FIG. 10 is an exploded perspective view of a main portion of a capacitor block according to a seventh embodiment of the present invention.
Figure 11:
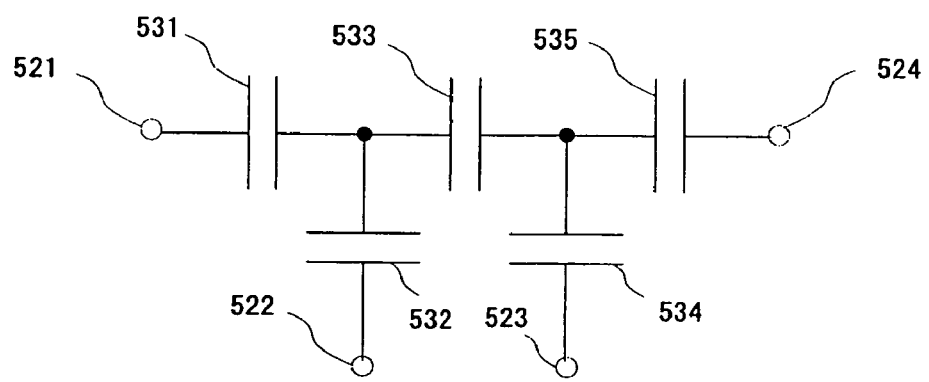
FIG. 11 is a circuit diagram of the capacitor block according to the seventh embodiment of the present invention.

FIGS. 10 and 11 illustrate a capacitor block according to a seventh embodiment of the present invention. FIG. 10 is an exploded perspective view of a main portion of the capacitor block according to a seventh embodiment of the present invention. FIG. 11 is a circuit diagram of the capacitor block according to the seventh embodiment of the present invention.

As shown in FIG. 10, a capacitor block 500 includes eight capacitor electrodes 501 to 508 arranged in the vertical direction. The capacitor electrodes 501 to 508 have a rectangular shape of the same dimensions. Any neighboring ones of the capacitor electrodes 501 to 508 are disposed in parallel so as to face each other with a predetermined distance therebetween. Additionally, as shown in FIG. 10, the capacitor electrode 502, which is the second electrode from the top, is electrically connected to the capacitor electrode 504, which is the fourth electrode from the top, using a connection conductor 511. The capacitor electrode 505, which is the fifth electrode from the top, is electrically connected to the capacitor electrode 507, which is the seventh electrode from the top, using a connection conductor 512.

Additionally, a first external terminal 521 is connected to the first capacitor electrode 501. A second external terminal 522 is connected to the third capacitor electrode 503. A third external terminal 523 is connected to the sixth capacitor electrode 506. A fourth external terminal 524 is connected to the eighth capacitor electrode 508.

In the above-described structure, when the second capacitor electrode 502 to the fourth capacitor electrode 504 together function as an electrode unit and the fifth capacitor electrode 505 to the seventh capacitor electrode 507 together function as another electrode unit, the two electrode units connected in series are considered to be disposed between the first capacitor electrode 501 located in the uppermost layer and the eighth capacitor electrode 508 located in the lowermost layer. If such an electrode unit is applied to the first to sixth embodiments, one electrode unit is considered to be disposed in series between the capacitor electrode located in the uppermost layer and the capacitor electrode located in the lowermost layer.

The circuit diagram of the capacitor block 500 having the structure according to the seventh embodiment is shown in FIG. 11. As shown in FIG. 11, a first capacitor 531, a third capacitor 533, and a fifth capacitor 535 are connected in series between the first external terminal 521 and the fourth external terminal 524. A second capacitor 532 is connected between the second external terminal 522 and a connection point between the first capacitor 531 and the third capacitor 533. A fourth capacitor 534 is connected between the third external terminal 523 and a connection point between the third capacitor 533 and the fifth capacitor 535.

Here, the first capacitor 531 is formed by the first capacitor electrode 501 and the second capacitor electrode 502 whereas the second capacitor 532 is formed by the second capacitor electrode 502, the third capacitor electrode 503, and the fourth capacitor electrode 504. The third capacitor 533 is formed by the fourth capacitor electrode 504 and the fifth capacitor electrode 505. Additionally, the fourth capacitor 534 is formed by the fifth capacitor electrode 505, the sixth capacitor electrode 506, and the seventh capacitor electrode 507. The fifth capacitor 535 is formed by the seventh capacitor electrode 507 and the eighth capacitor electrode 508. In the above-described structure, if dimensions of all of the capacitor electrodes 501 to 508 are the same and if the distances between neighboring ones of the capacitor electrodes 501 to 508 are the same and the dielectric constants between the neighboring ones are the same, the electrostatic capacitance of the second capacitor 532 or the fourth capacitor 534 is double the electrostatic capacitance of each of the first capacitor 531, the third capacitor 533, and the fifth capacitor 535.

Since the capacitor block 500 can be easily used as a four-terminal π-type capacitor block, a high-frequency high-pass filter or a high-frequency bandpass filter of reduced size can be easily manufactured.

An eighth embodiment of the present invention is described next.

Figure 12:
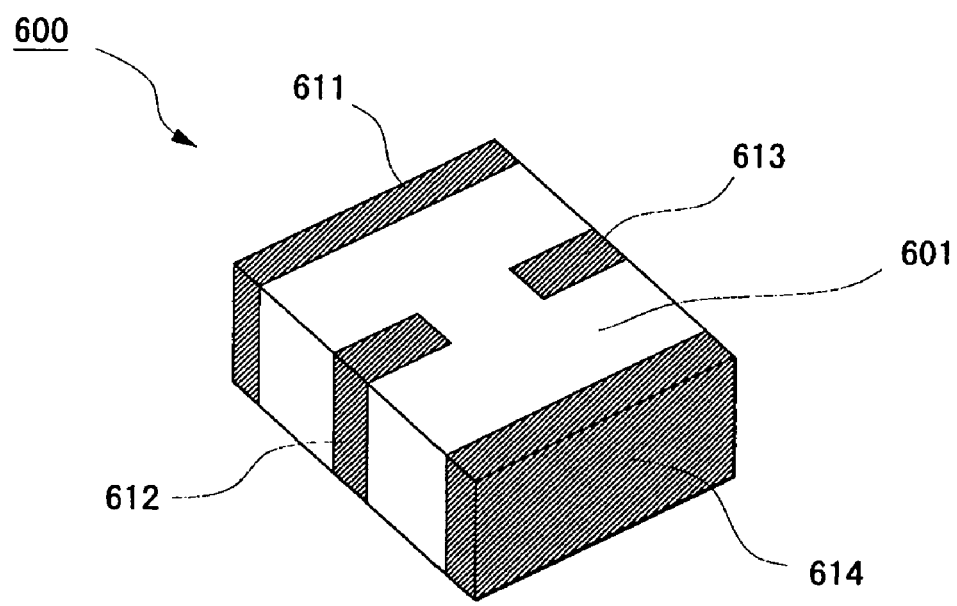
FIG. 12 is an external perspective view of a composite capacitor element according to an eighth embodiment of the present invention.
Figure 13:
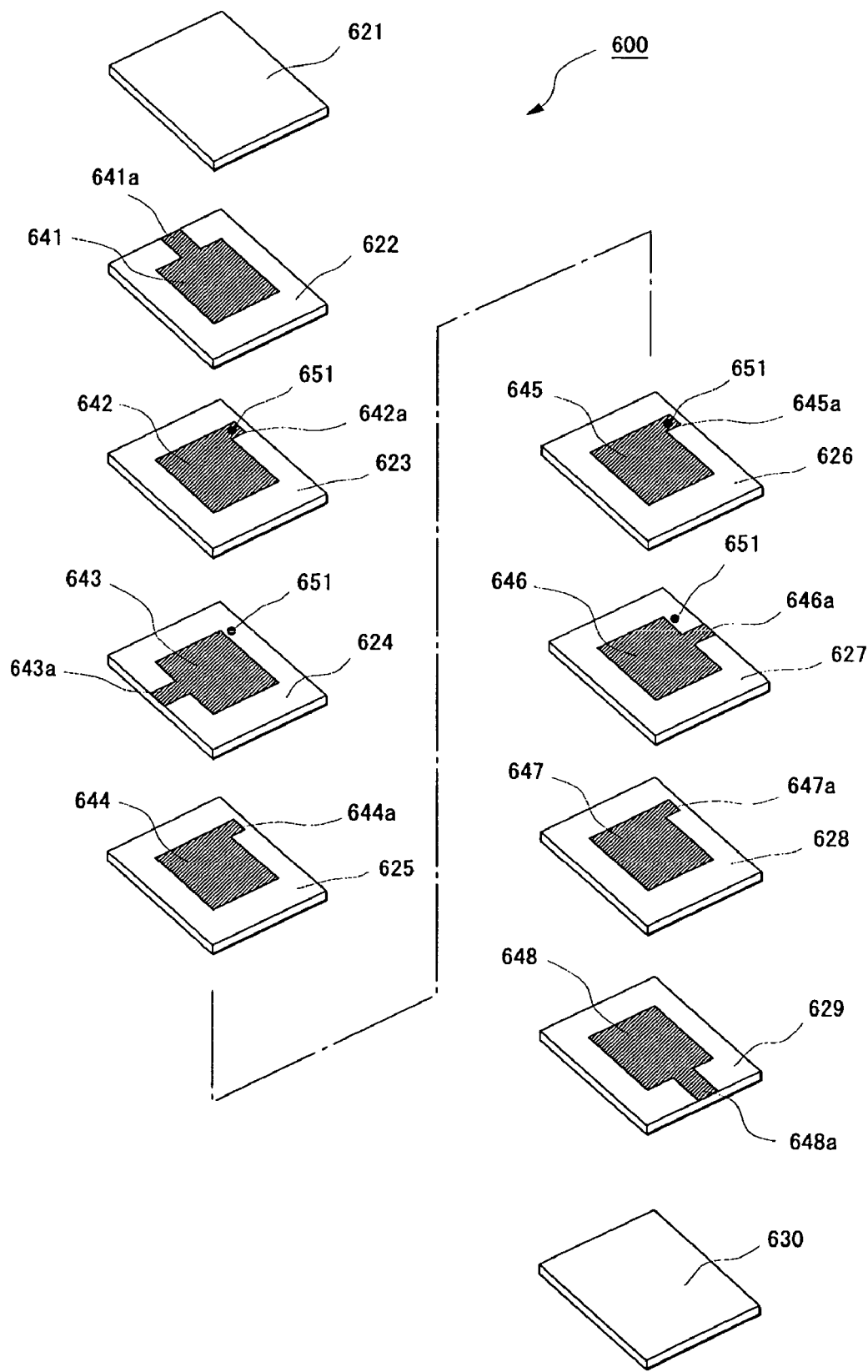
FIG. 13 is an exploded perspective view of the composite capacitor element according to the eighth embodiment of the present invention.

FIGS. 12 and 13 illustrate a composite capacitor element according to the eighth embodiment of the present invention. More specifically, FIG. 12 is an external perspective view of the composite capacitor element according to the eighth embodiment of the present invention while FIG. 13 is an exploded perspective view of the composite capacitor element according to the eighth embodiment of the present invention.

The composite capacitor element according to the eighth embodiment includes the capacitor block according to the seventh embodiment as an element.

As shown in FIGS. 12 and 13, a composite capacitor element 600 includes a base 601 and external electrodes 611 to 614. The base 601 includes dielectric layers 621 and 630 and stacked dielectric layers 622 to 629 having capacitor electrodes 641 to 648 formed thereon, respectively. The external electrodes 611 to 614 are connected to predetermined capacitor electrodes through the outer surface of the base 601.

Each of the dielectric layers 621 to 630 is formed of a sintered ceramic having a rectangular sheet shape. The sintered ceramic is composed of, for example, a dielectric ceramic material consisting primarily of magnesium titanate or a LTCC material.

The capacitor electrode 641 corresponds to the first capacitor electrode 501 of the seventh embodiment. The capacitor electrode 641 is formed on the upper surface of the dielectric layer 622 so as to have a rectangular shape in plan view in the central section of the upper surface. The capacitor electrode 641 further includes a connection electrode 641a extending from a side of the rectangular shape. The connection electrode 641a is connected to the external electrode 611.

The capacitor electrode 642 corresponds to the second capacitor electrode 502 of the seventh embodiment. The capacitor electrode 642 is formed on the upper surface of the dielectric layer 623 so as to have a rectangular shape in plan view in the central section of the upper surface. The capacitor electrode 642 further includes a connection electrode 642a. A via conductor 651 that passes through the dielectric layers 623 in the thickness direction thereof is connected to the connection electrode 642a. Additionally, the via conductor 651 is connected to a connection electrode 644a of the capacitor electrode 644 formed on the upper surface of the dielectric layer 625 using another via conductor 651 formed in the dielectric layer 624 in the same way.

The capacitor electrode 643 corresponds to the third capacitor electrode 503 of the seventh embodiment. The capacitor electrode 643 is formed on the upper surface of the dielectric layer 624 so as to have a rectangular shape in plan view in the central section of the upper surface. The capacitor electrode 643 further includes a connection electrode 643a extending from a side of the rectangular shape. The connection electrode 643a is connected to the second external electrode 612.

The capacitor electrode 644 corresponds to the fourth capacitor electrode 504 of the seventh embodiment. The capacitor electrode 644 is formed on the upper surface of the dielectric layer 625 so as to have a rectangular shape in plan view in the central section of the upper surface. The capacitor electrode 644 further includes the connection electrode 644a extending from a side of the rectangular shape. The connection electrode 644a is connected to the capacitor electrode 642 using the via conductor 651.

The capacitor electrode 645 corresponds to the fifth capacitor electrode 505 of the seventh embodiment. The capacitor electrode 645 is formed on the upper surface of the dielectric layer 626 so as to have a rectangular shape in plan view in the central section of the upper surface. The capacitor electrode 645 further includes a connection electrode 645a extending from a side of the rectangular shape. A via conductor 651 that passes through the dielectric layer 626 in the thickness direction thereof is connected to the connection electrode 645a. Additionally, this via conductor 651 is connected to a connection electrode 647a of the capacitor electrode 647 formed on the upper surface of the dielectric layer 628 using another via conductor 651 formed in the dielectric layer 425 in the same way.

The capacitor electrode 646 corresponds to the sixth capacitor electrode 506 of the seventh embodiment. The capacitor electrode 646 is formed on the upper surface of the dielectric layer 627 so as to have a rectangular shape in plan view in the central section of the upper surface. The capacitor electrode 646 further includes a connection electrode 646a extending from a side of the rectangular shape. The connection electrode 646a is connected to the third external terminal 613.

The capacitor electrode 647 corresponds to the seventh capacitor electrode 507 of the seventh embodiment. The capacitor electrode 647 is formed on the upper surface of the dielectric layer 628 so as to have a rectangular shape in plan view in the central section of the upper surface. The capacitor electrode 647 further includes a connection electrode 647a extending from a side of the rectangular shape. The connection electrode 647a is connected to the capacitor electrode 645 using the via conductor 651.

The capacitor electrode 648 corresponds to the eighth capacitor electrode 508 of the seventh embodiment. The capacitor electrode 648 is formed on the upper surface of the dielectric layer 629 so as to have a rectangular shape in plan view in the central section of the upper surface. The capacitor electrode 648 further includes a connection electrode 648a extending from a side of the rectangular shape. The connection electrode 648a is connected to the fourth external electrode 614.

Each of the capacitor electrodes 641 to 648 is formed from a metallic thin film generated by sintering metal paste. For example, the metal paste consists of primarily a metallic material, such as Pd, Ag, or Cu.

The external electrodes 611 to 614 are formed from a material similar to that of the capacitor electrodes 641 to 648. In order to increase the solder wettability, solder plating (not shown) is conducted on the surfaces of the external electrodes 611 to 614.

The composite capacitor element 600 according to the present embodiment can be applied to a wide range of applications. By using this composite capacitor element 600, a four-terminal π-type capacitor block can be easily used. Accordingly, a high-frequency highpass filter or a high-frequency bandpass filter of reduced size can be easily manufactured.

A ninth embodiment of the present invention is described next.

Figure 14:
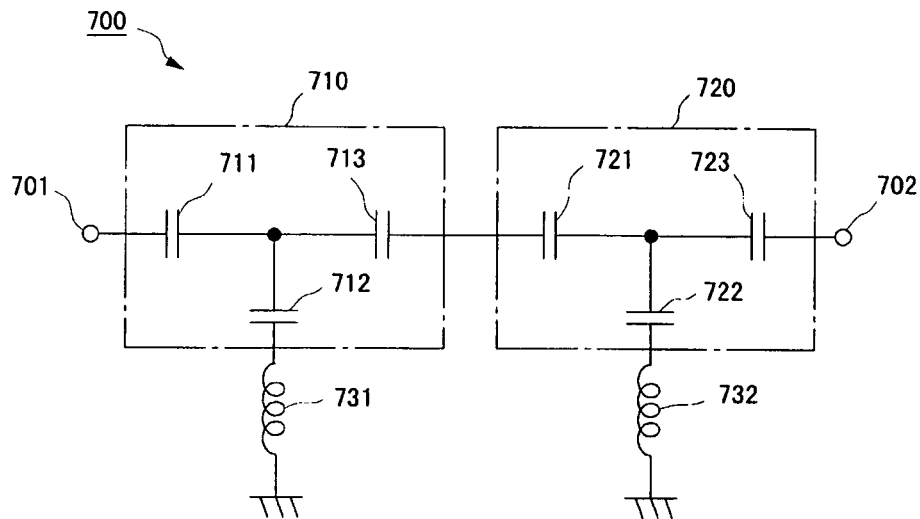
FIG. 14 is a circuit diagram of a highpass filter according to a ninth embodiment of the present invention.
Figure 15:
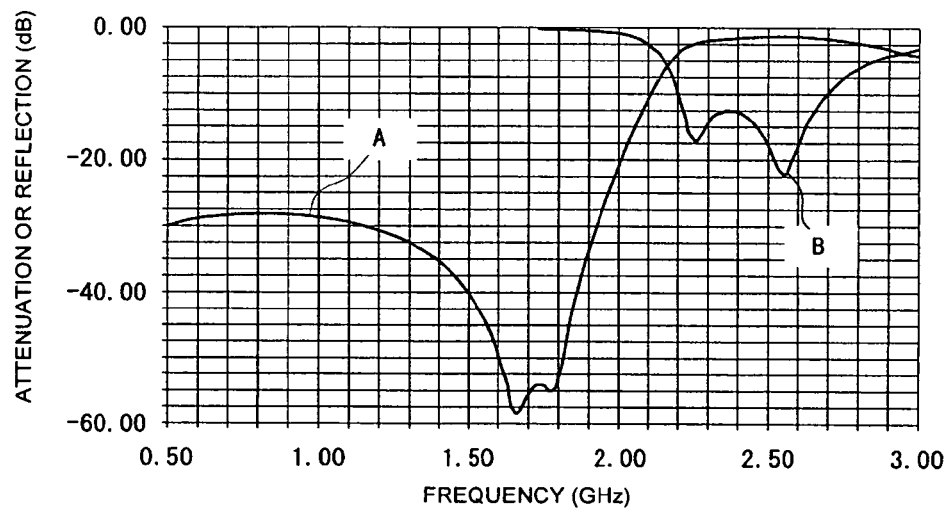
FIG. 15 illustrates a frequency characteristic of the highpass filter according to the ninth embodiment of the present invention.
Figure 16:
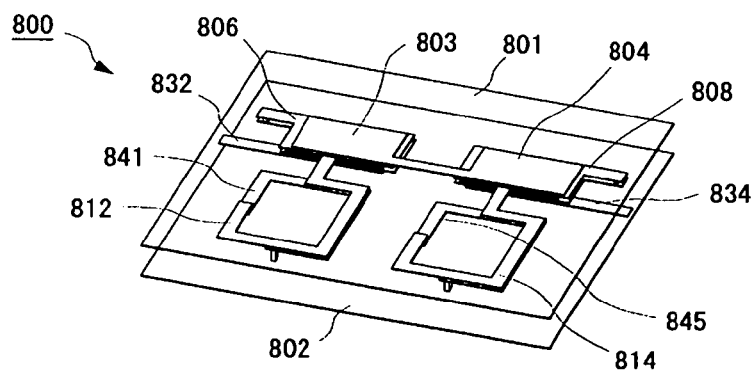
FIG. 16 is a transparent perspective view of a laminated circuit board according to the ninth embodiment of the present invention.
Figure 17:
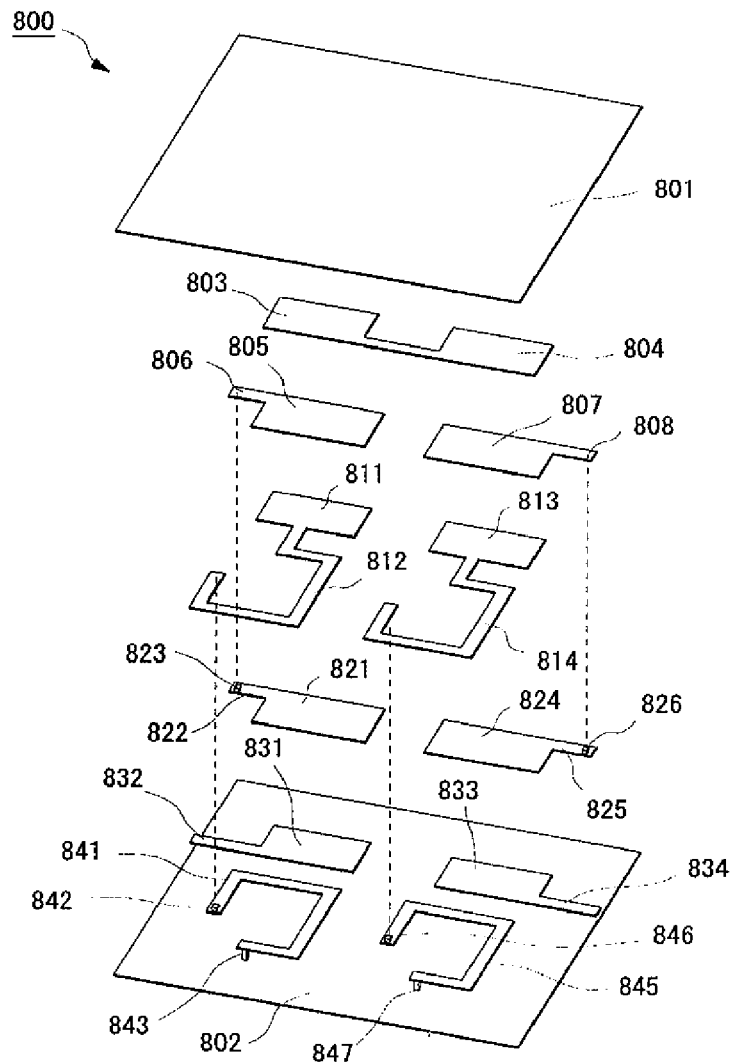
FIG. 17 is an exploded perspective view of the laminated circuit board according to the ninth embodiment of the present invention.
Figure 17:
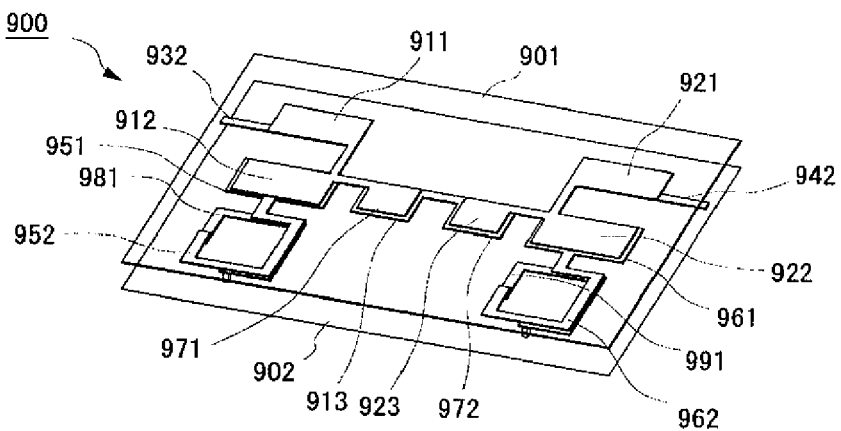

FIGS. 14 to 19 illustrate a ninth embodiment of the present invention. That is, FIG. 14 is a circuit diagram of a highpass filter according to the ninth embodiment of the present invention. FIG. 15 illustrates a frequency characteristic of the highpass filter according to the ninth embodiment of the present invention. FIG. 16 is a transparent perspective view of a laminated circuit board according to the ninth embodiment of the present invention. FIG. 17 is an exploded perspective view of the laminated circuit board according to the ninth embodiment of the present invention. FIG. 18 is a transparent perspective view of a known laminated circuit board for comparison with the ninth embodiment. FIG. 19 is an exploded perspective view of a known laminated circuit board for comparison with the ninth embodiment.

The ninth embodiment is described with reference to a laminated circuit board in which a highpass filter 700 having a circuit configuration shown in FIG. 14 is embedded. The laminated circuit board 700 includes two of the above-described three-terminal T-type capacitor blocks. One of the two capacitor blocks (a capacitor block 710) includes a first capacitor 711, a second capacitor 712, and a third capacitor 713. The other capacitor block (a capacitor block 720) includes a first capacitor 721, a second capacitor 722, and a third capacitor 723.

An input terminal 701 of the highpass filter 700 is connected to one end of the first capacitor 711 of the capacitor block 710. The other end of the first capacitor 711 is connected to one end of the second capacitor 712 and one end of the third capacitor 713. The other end of the second capacitor 712 is connected to ground via an inductor 731. Additionally, the other end of the third capacitor 713 is connected to one end of the first capacitor 721 of the capacitor block 720. The other end of the first capacitor 721 is connected to one end of the second capacitor 722 and one end of the third capacitor 723. The other end of the second capacitor 722 is connected to ground via an inductor 732. Additionally, the other end of the third capacitor 723 is connected to an output terminal 702.

FIGS. 16 and 17 illustrate the laminated circuit board including a circuit board in which the highpass filter 700 is embedded. In FIGS. 16 and 17, for ease of understanding the structure of the highpass filter 700, only a conductor portion of the highpass filter 700 is shown. Thus, dielectric materials disposed between conductors of the layers are not shown. As shown in FIGS. 16 and 17, a laminated circuit board 800 includes a plurality of rectangle parallelepiped board composed of an LTCC (not shown). One or more coil conductors and one or more capacitor electrodes are provided on each of the layers of the board. The electrodes disposed in the different layers are connected to each other at predetermined locations using via conductors. Thus, the highpass filter 700 is formed in the board.

That is, the laminated circuit board 800 includes seven layers from a first layer (the uppermost layer) to a seventh layer (the lowermost layer). An electrode is disposed in each layer. GND electrodes (ground electrodes) 801 and 802 are disposed in the first uppermost layer and the seventh lowermost layer, respectively. A connection electrode having capacitor electrodes 803 and 804 formed at either end thereof is disposed in the second layer.

In addition, a capacitor electrode 805 having a connection electrode 806 and a capacitor electrode 807 having a connection electrode 808 are disposed in the third layer. Here, the capacitor electrode 805 faces the capacitor electrode 803 in the second layer. The capacitor electrode 807 faces the capacitor electrode 804 in the second layer.

A loop coil conductor 812 having a capacitor electrode 811 connected to one end thereof and a loop coil conductor 814 having a capacitor electrode 813 connected to one end thereof are disposed in the fourth layer. Here, the capacitor electrode 811 faces the capacitor electrode 805 disposed in the third layer. The capacitor electrode 813 faces the capacitor electrode 807 disposed in the third layer.

A capacitor electrode 821 having a connection electrode 822 and a capacitor electrode 824 having a connection electrode 825 are disposed in the fifth layer. Here, the capacitor electrode 821 faces the capacitor electrode 811 disposed in the fourth layer. The capacitor electrode 824 faces the capacitor electrode 813 disposed in the fourth layer. In addition, the connection electrode 822 is connected to the connection electrode 806 disposed in the third layer using a via conductor 823. The connection electrode 825 is connected to the connection electrode 808 disposed in the third layer using a via conductor 826.

A capacitor electrode 831 having an input terminal electrode 832, a capacitor electrode 833 having an output terminal electrode 834, and two loop coil conductors 841 and 845 are disposed in the sixth layer. Here, the capacitor electrode 831 faces the capacitor electrode 821 disposed in the fifth layer. The capacitor electrode 833 faces the capacitor electrode 824 disposed in the fifth layer. In addition, the loop coil conductor 841 is disposed so as to overlap the loop coil conductor 812 disposed in the fourth layer. One end of the loop coil conductor 841 is connected to the other end of the loop coil conductor 812 using a via conductor 842. The other end of the loop coil conductor 841 is connected to the GND electrode 802 using a via conductor 843. In addition, the loop coil conductor 845 is disposed so as to overlap the loop coil conductor 814 disposed in the fourth layer. One end of the loop coil conductor 845 is connected to the other end of the loop coil conductor 814 using a via conductor 846. The other end of the loop coil conductor 845 is connected to the GND electrode 802 using a via conductor 847. Thus, the loop coil conductors 812 and 841 form a coil whereas the loop coil conductors 814 and 845 form a coil.

In such a structure, the components of the highpass filter 700 shown in FIG. 14 are formed as follows. That is, the first capacitor 711 of the capacitor block 710 is formed by the capacitor electrodes 831 and 821. The second capacitor 712 is formed by the capacitor electrodes 821, 811, and 805. The third capacitor 713 is formed by the capacitor electrodes 803 and 805. In addition, the inductor 731 is formed by the coil formed by the coil conductors 812 and 841.

The first capacitor 721 of the capacitor block 720 is formed by the capacitor electrodes 804 and 807. The second capacitor 722 is formed by the capacitor electrodes 824, 813, and 807. The third capacitor 723 is formed by the capacitor electrodes 824 and 833. In addition, the inductor 732 is formed by the coil formed by the coil conductors 814 and 845.

Furthermore, the GND electrode 801 in the uppermost layer and the GND electrode 802 in the lowermost layer have a function of shielding the highpass filter 700 from electromagnetic waves coming from the outside.

The frequency characteristic of the highpass filter 700 formed by using the above-described laminated circuit board 800 is shown in FIG. 15. In FIG. 15, the abscissa represents the frequency and the ordinate represents the attenuation or reflection. In addition, a characteristic curve denoted by "A" indicates the attenuation and a characteristic curve denoted by "B" indicates the reflection.

As a comparative example, a laminated circuit board forming a highpass filter without using the above-described capacitor block is shown in FIGS. 18 and 19. In FIGS. 18 and 19, for ease of understanding the structure of this highpass filter, only a conductor portion of the highpass filter is shown. Thus, dielectric materials disposed between conductors of the layers are not shown.

As shown in FIGS. 18 and 19, a laminated circuit board 900 includes a plurality of rectangle parallelepiped board composed of an LTCC (not shown). One or more coil conductors and one or more capacitor electrodes are provided in each of the layers of the laminated circuit board 900. The electrodes disposed in the different layers are connected to each other at predetermined locations using via conductors. Thus, a highpass filter 700 without using the capacitor block according to the present invention is formed in the laminated circuit board 900.

That is, the laminated circuit board 900 includes five layers from a first layer (the uppermost layer) to a fifth layer (the lowermost layer). An electrode is disposed in each layer. GND electrodes (ground electrodes) 901 and 902 are disposed in the first uppermost layer and the fifth lowermost layer, respectively. Capacitor electrodes 911, 912, and 913 electrically connected to each other and capacitor electrodes 921, 922, and 923 electrically connected to each other are disposed in the second layer.

In addition, the third layer includes a capacitor electrode 931 having an input terminal electrode 932, a capacitor electrode 941 having an output terminal electrode 942, a connection electrode having capacitor electrodes 971 and 972 at either end thereof, a loop coil conductor 952 having a capacitor electrode 951 connected to one end thereof, and a loop coil conductor 962 having a capacitor electrode 961 connected to one end thereof. Here, the capacitor electrode 931 faces the capacitor electrode 911 disposed in the second layer. The capacitor electrode 951 faces the capacitor electrode 912 disposed in the second layer. The capacitor electrode 971 faces the capacitor electrode 913 disposed in the second layer. In addition, the capacitor electrode 941 faces the capacitor electrode 921 disposed in the second layer. The capacitor electrode 961 faces the capacitor electrode 922 disposed in the second layer. The capacitor electrode 972 faces the capacitor electrode 923 disposed in the second layer.

Two loop coil conductors 981 and 991 are provided in the fourth layer. Here, the loop coil conductor 981 is disposed so as to overlap the loop coil conductor 952 in the third layer. One end of the loop coil conductor 981 is connected to the other end of the loop coil conductor 952 using a via conductor 982. The other end of the loop coil conductor 981 is connected to the GND electrode 902 using a via conductor 983. In addition, the loop coil conductor 991 is disposed so as to overlap the loop coil conductor 962 in the third layer. One end of the loop coil conductor 991 is connected to the other end of the loop coil conductor 962 using a via conductor 992. The other end of the loop coil conductor 991 is connected to the GND electrode 902 using a via conductor 993. Thus, the loop coil conductors 952 and 981 form a coil while the loop coil conductors 962 and 991 form a coil.

In such a structure, the components of the highpass filter 700 shown in FIG. 14 are formed as follows. That is, the first capacitor 711 is formed by the capacitor electrodes 931 and 911. The second capacitor 712 is formed by the capacitor electrodes 912 and 951. The third capacitor 713 is formed by the capacitor electrodes 913 and 971. In addition, the inductor 731 is formed by the coil formed by the coil conductors 952 and 981.

In addition, the first capacitor 721 is formed by the capacitor electrodes 972 and 923. The second capacitor 722 is formed by the capacitor electrodes 922 and 961. The third capacitor 723 is formed by the capacitor electrodes 921 and 941. In addition, the inductor 732 is formed by the coil formed by the coil conductors 962 and 991.

As noted above, in the laminated circuit board 900 serving as a highpass filter formed without using the capacitor block according to the above-described embodiment, the area of the highpass filter forming region is increased, and therefore, the size of the laminated circuit board 900 is increased. In contrast, the size of the laminated circuit board 800 using the capacitor block according to the present embodiment can be reduced to the required minimum size, and therefore, the size can be minimized.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit if the invention. The scope of the invention is indicated by the appended claims rather than by the foregoing description. All changes which come within the meaning and range of equivalency of claims are to be embraced within their scope."

What is claimed is:

1. A laminated board comprising:
    an electronic component formed from a conductor pattern; and
    a capacitor block comprising a plurality of capacitor electrodes so that neighboring capacitor electrodes face each other with a dielectric material disposed therebetween, the capacitor electrodes comprising a first terminal electrode connected to one input/output terminal, a second terminal electrode connected to the electronic component, a third terminal electrode connected to another capacitor block or another input/output terminal, and a first and second common electrode isolated from the outside;
    wherein one surface of the first common electrode faces one surface of the first terminal electrode with the dielectric material and no capacitor electrode or other conductive element therebetween, one surface of the second terminal electrode faces the other surface of the first common electrode with the dielectric material and no capacitor electrode or other conductive element therebetween, one surface of the second common electrode faces the other surface of the second terminal electrode with the dielectric material and no capacitor electrode or other conductive element therebetween, the other surface of the second common electrode faces one surface of the third terminal electrode with the dielectric material and no capacitor electrode or other conductive element therebetween, and the second common electrode is electrically connected to the first common electrode.

2. The laminated board according to claim 1, further comprising a third and a fourth common electrode and wherein one surface of the third common electrode faces the other surface of the first terminal electrode with the dielectric material therebetween and the third common electrode is electrically connected to the first common electrode, and wherein one surface of the fourth common electrode faces the other surface of the second terminal electrode with the dielectric material therebetween and the fourth common electrode is electrically connected to the second common electrode.

3. The laminated board according to claim 1, wherein the dimension of the first common electrode is greater than the dimension of each of the first and the third terminal electrode and wherein the dimension of the second common electrode is greater than the dimension of each of the third and the second electrode.

4. The laminated board according to claim 1, wherein the capacitor block is configured as part of a high-frequency highpass filter.

5. The laminated board according to claim 1, wherein the capacitor block is configured as part of a filter.

6. The laminated board according to claim 1, wherein the first and second common electrodes are electrically isolated from the electrical component.

7. The laminated board according to claim 1, wherein the first, second, and third terminal electrodes are electrically isolated from one another.

* * * * *